United States Patent [19]
Nakata

[11] Patent Number: 6,084,256
[45] Date of Patent: *Jul. 4, 2000

[54] SEMICONDUCTOR INTEGRATED CIRCUIT DEVICE

[75] Inventor: Shigeharu Nakata, Yokohama, Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/833,619

[22] Filed: Apr. 8, 1997

[30] Foreign Application Priority Data

Apr. 10, 1996 [JP] Japan .................................. 8-086976

[51] Int. Cl.⁷ .................................................. H01L 27/10
[52] U.S. Cl. .......................................... 257/211; 257/758
[58] Field of Search .................................... 257/211, 758, 257/773

[56] References Cited

U.S. PATENT DOCUMENTS 5,773,857 6/1998 Ura ............................................ 257/211

FOREIGN PATENT DOCUMENTS 4-322460 11/1992 Japan .
5-13722 1/1993 Japan .

*Primary Examiner*—Mark V. Prenty
*Attorney, Agent, or Firm*—Finnrgan, Henderson, Farabow, Garrett & Dunner, L.L.P.

[57] ABSTRACT

A semiconductor integrated circuit has a dummy gate electrode layer formed on a semiconductor substrate, with a gate insulation film interposed. On the first layer insulation film formed on the top of the dummy gate electrode layer, the first signal line is arranged, intersecting with the dummy gate electrode material layer substantially at right angles. On the second layer insulation film formed on the first signal line, a power-supply wiring layer is arranged, extending substantially parallel, and is located right above the dummy gate electrode layer. A contact hole is provided, electrically connecting the power-supply layer to the dummy gate electrode layer.

13 Claims, 4 Drawing Sheets

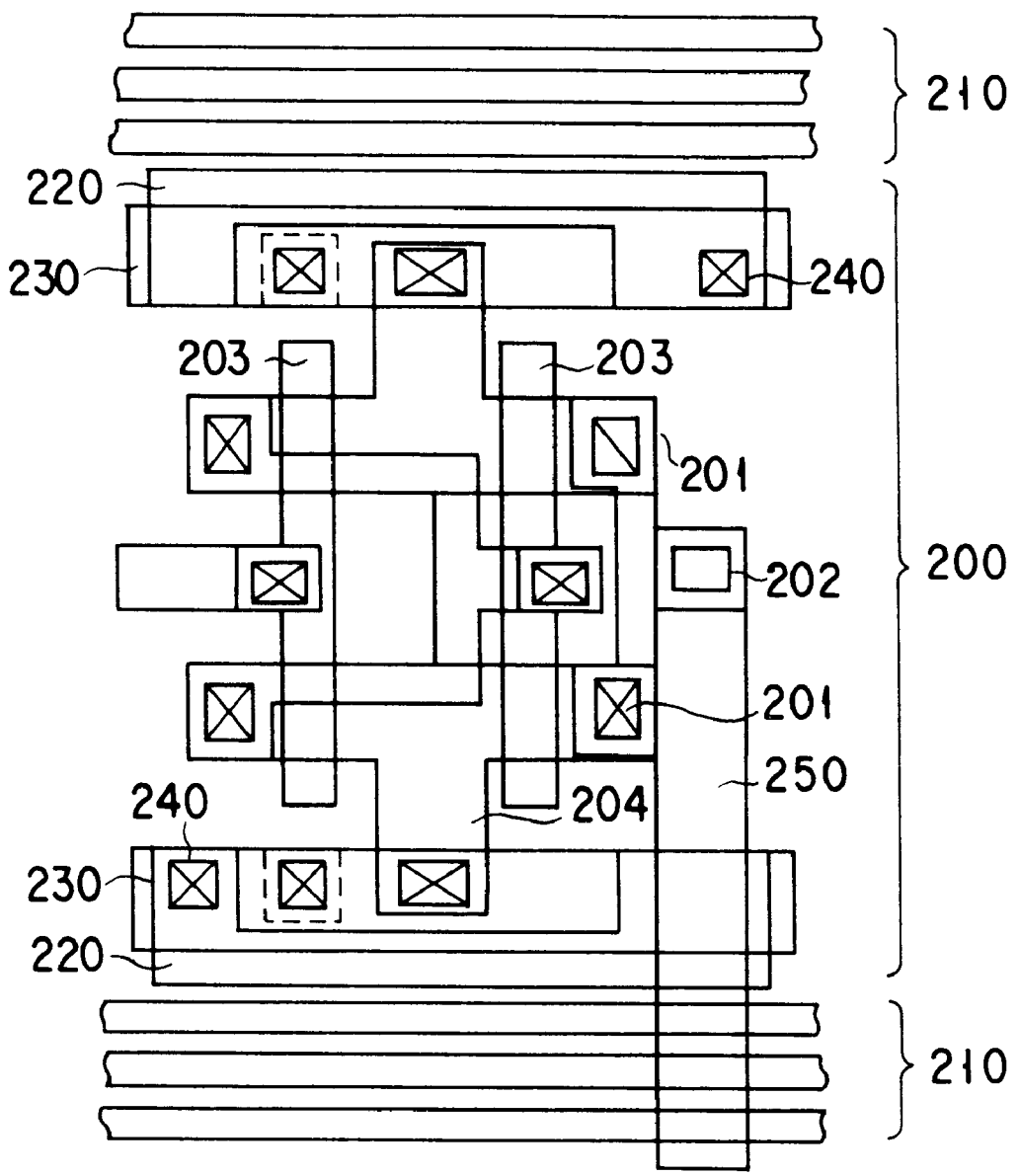
F I G. 7

SEMICONDUCTOR INTEGRATED CIRCUIT DEVICE

BACKGROUND OF THE INVENTION

This invention relates to a semiconductor integrated circuit device, and more particularly to a semiconductor integrated circuit in which dummy-gate electrode layers are arranged to reduce the size variation of the gate electrode layers of MOSFETs.

In recent years, semiconductor elements have been made smaller and smaller. Technique of forming fine elements has therefore become increasingly important.

Integrated circuits known as ASICs and full-custom LSIs, in particular, have a circuit pattern (i.e., element layout) on the chip. The circuit pattern is irregular in most cases to meet users' demands, unlike memory cell arrays and gate arrays which have repeated regular patterns. Being irregular, the circuit pattern results in a variation in size of transistors, manufactured.

Due to electro-loading effect, metal wiring layers cannot have same size as is desired. This causes problems such as disconnection of wires and reduction in width of the wires.

The electro-loading effect is an adverse influence a non-uniform pattern imposes on the diffraction of light when exposure is performed by using a mask having portions densely arranged and portions sparsely arranged.

If the gate electrode layers, in particular, are not formed with high precision to have the design size, they will increase the leakage current of the transistors and will change the operating frequency and other various characteristics of the transistors. Consequently, the yield of the LSIs will decrease. In the worst case, flawless LSIs cannot be manufactured at all.

To prevent electro-loading effect resulting from a irregular circuit pattern which is composed of elements densely arranged and elements sparsely arranged, the circuit pattern should be re-designed. For example, a dummy pattern made of polysilicon may be formed on that part of a substrate on which no semiconductor elements are provided, as is disclosed Jpn. Pat. Appln. KOKAI Publications Nos. 4-322460 and 5-13722. The whole circuit pattern on the substrate is thereby rendered uniform in density, thus suppressing the electro-loading effect.

Recently, the integration density of semiconductor chips have been increasing. Therefore, multi-layer wiring technique is now used widely to manufacture semiconductor chips of high integration density. This technique consists in forming an insulting film on a dummy pattern and providing a power-supply wiring layer on the insulating film. The power-supply wiring layer not only covers the insulating film, but also fills the contact holes made in the film. The power-wiring layer is therefore electrically connected to the dummy pattern. Hence, the dummy pattern does not constitute stray capacitance, though it is made of polysilicon.

However, signal lines, formed on the insulating film and located above the dummy pattern, cannot be electrically connected to the dummy pattern by using the contact holes made in the insulting film. This is because the currents flowing through the signal lines are extremely small, inevitably increasing the impedance.

FIG. 1 is a schematic representation of a conventional semiconductor chip 320. A plurality of bonding pads 310 are mounted on the edge portions of the top surface of the chip 320, for supplying power to function blocks 300 including a CUP, a ROM, a timer, a RAM, an SIO and the like. A plurality of dummy patterns 330 made of polysilicon are arranged on that top surface area of the chip 320, where neither the pads 310 nor the blocks 300 are provided.

FIG. 2 is an enlarged perspective view of the area A shown in FIG. 1. As can be understood from FIG. 2, signal lines 350 are provided above the dummy patterns 330. Hence, as mentioned above, the signal lines 350 cannot be electrically connected to the dummy patterns 330. Parasitic capacitance C1 is generated between he dummy patterns 330 and the signal lines 350, and parasitic capacitance C2 between the chip 320 and the signal lines 350. Both parasitic capacitances C1 and C2 affect the characteristics of the integrated circuit. When the dummy patterns 330 extend parallel to the signal lines 350 and are located below the signal lines 350, the parasitic capacitances are so great as to cause the integrated circuit to malfunction.

As described above, the conventional integrated circuit has the problem in that parasitic capacitances will be generated if dummy patterns are formed to suppress the electro-loading effect.

BRIEF SUMMARY OF THE INVENTION

An object of the present invention is to provide a semiconductor integrated circuit device which has dummy gate electrode layers arranged for reducing variation in size of, in particular, MOSEET gate electrode layers and for suppressing an increase in parasitic capacity of signal lines.

In order to achieve the above-mentioned object, there is provided a semiconductor integrated circuit device comprising: a semiconductor substrate; a dummy gate electrode layer formed on a gate insulation film which is formed on the semiconductor substrate; a first insulation film formed on the dummy gate electrode layer; a first signal line formed on the first insulation film and intersecting with the dummy gate electrode layer substantially at right angles; a second layer insulation film formed on the first signal line; a power-supply wiring layer formed on the second insulation film and arranged substantially in parallel to and right above the dummy gate electrode layer; and a contact hole for electrically connecting the power supply layer to the dummy gate electrode layer.

Another semiconductor integrated circuit device according to the invention comprises: a semiconductor substrate; a dummy gate electrode layer formed on a gate insulation film which is formed on the semiconductor substrate; a first insulation film formed on the dummy gate electrode layer; power-supply wiring layer formed on the first insulation film and arranged substantially in parallel to and right above the dummy gate electrode layer; a second layer insulation film formed on the power supply layer; a first signal wiring formed on the second insulation film, and intersecting with the dummy gate electrode layer substantially at right angles; and a contact hole for electrically connecting the power-supply wiring layer to the dummy gate electrode layer.

A still another semiconductor integrated circuit device of this invention comprises: a standard cell having a logic circuit and a power-supply wiring layer for supplying power to the logic circuit; a pair of first signal lines extending substantially parallel to the power-supply wiring layer and arranged in an area with no standard cell formed; a dummy gate electrode layer not superimposed on the first signal lines and formed on the first insulation film which is provided on the lower surface of the power-supply wiring layer; a contact hole for electrically connecting the power-supply wiring layer to the dummy gate electrode layer; and a second signal line intersecting with the power-supply wiring layer substantially at right angles and arranged on the second insulation film which is provided on the power-supply wiring layer, for inputting and outputting signals to and from the logic circuit incorporated in the standard cell.

Another semiconductor integrated circuit device of this invention comprises: a semiconductor element formed on a semiconductor substrate and having a gate electrode; a dummy gate electrode layer formed of the same material as the gate electrode; power-supply wiring layer arranged substantially in parallel to the dummy gate electrode layer and provided on a first layer insulation film, for supplying power to the semiconductor element; a contact hole for electrically connecting the dummy gate electrode layer to the power supply layer; a first signal line arranged on a second insulation film which is provided on the power-supply wiring layer, and intersecting the power-supply wiring layer substantially at right angles; and a second signal line arranged in an area other than the area in which the semiconductor element, dummy-gate electrode layer, power-supply wiring layer and first signal line are formed, and extending substantially parallel to the dummy gate electrode layer, and made of the same layer as the dummy gate electrode layer.

A still another semiconductor integrated circuit device comprises: a semiconductor element having a gate electrode; power-supply wiring layer for supplying power to the semiconductor element; a first signal line substantially in the same plane as the power-supply wiring layer; a dummy gate electrode layer extending parallel to the power-supply wiring layer, arranged on a first insulation film which is provided on the lower surface of the power-supply wiring layer, and arranged in such a manner not to be superimposed on the first-signal line; a contact hole for electrically connecting the power-supply wiring layer to the dummy gate electrode layer; and a second signal line intersecting with the power-supply wiring layer substantially at right angles and arranged on the second insulation film which is provided on the power-supply wiring layer.

As described above, the semiconductor integrated circuit device of this invention has a dummy electrode layer for suppressing the electro-loading effect. The dummy electrode layer intersects with the signal line substantially at right angles. The parasitic capacity generated between the dummy electrode layer and the signal line is therefore small and can be easily predicted.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a top view of a semiconductor chip according to a the second embodiment of the invention.

DETAILED DESCRIPTION OF THE INVENTION

Figure 1:
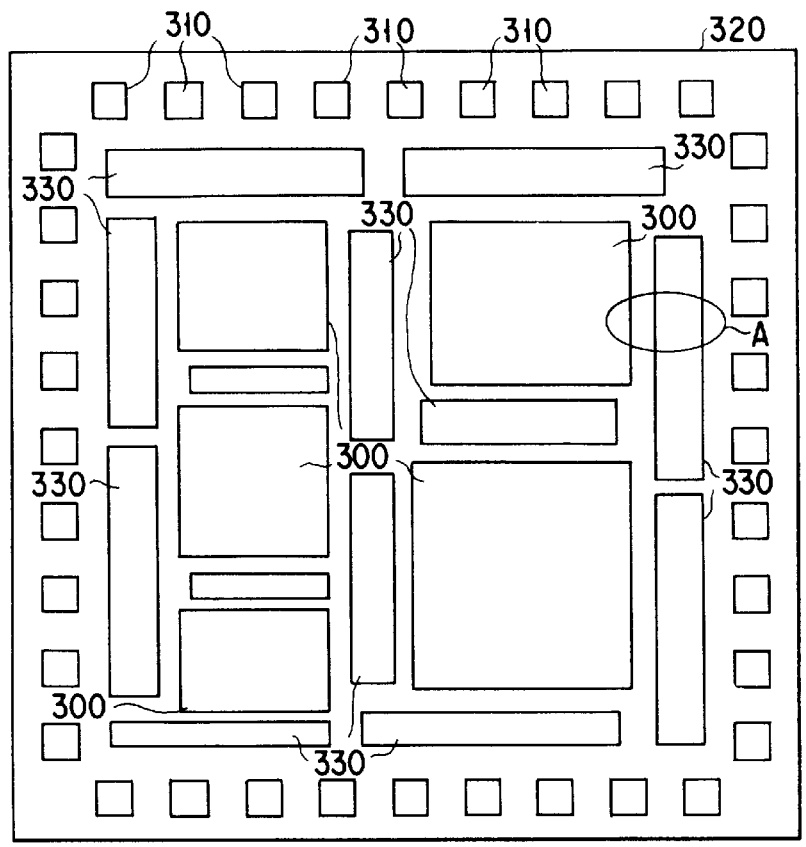
FIG. 1 is a top view of a conventional semiconductor chip.
Figure 2:
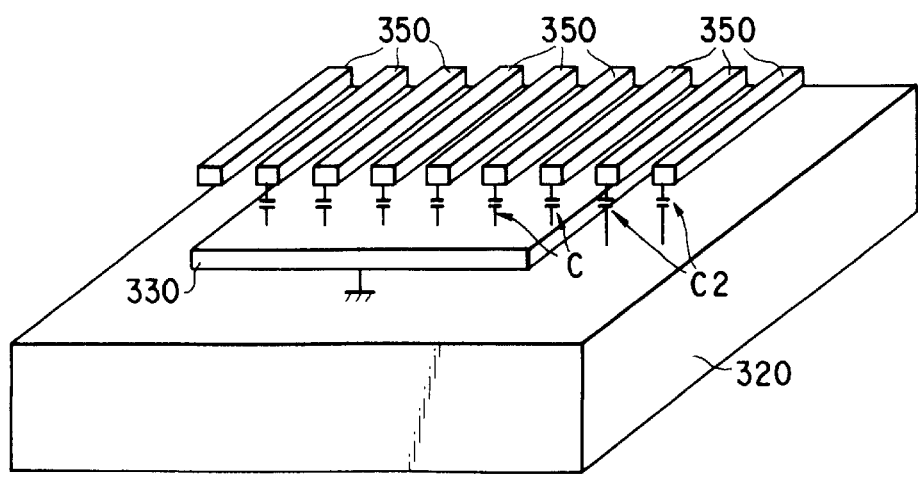
FIG. 2 is an enlarged perspective view of portion A of the clip.
Figure 3:
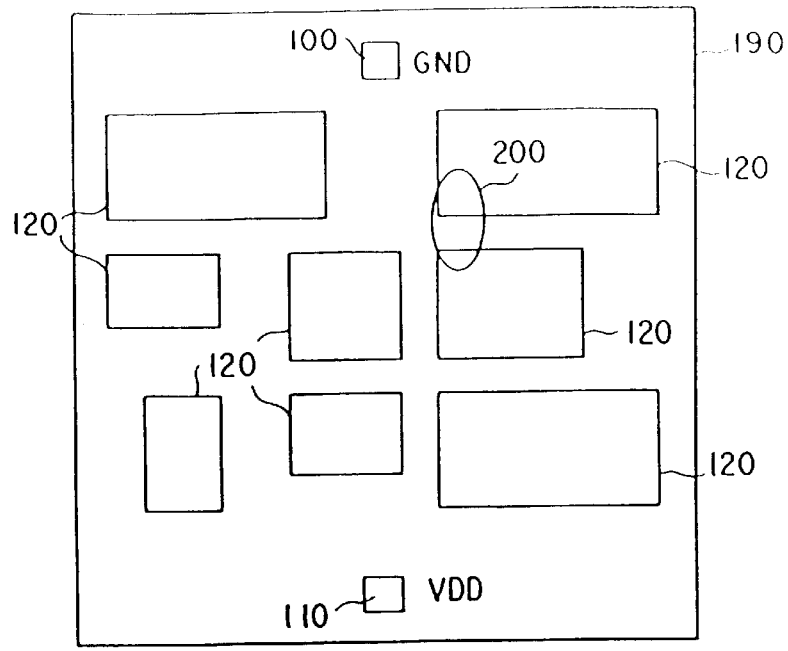
FIG. 3 is a top view of the semiconductor chip according to a first embodiment of this invention.

Referring now to drawings, the first embodiment of this invention will be described in detail. As shown in FIG. 3, bonding pads 100 and 110 supply power to a plurality of functional blocks 120 such as a CPU, a memory, etc. arranged on the substrate 190 of the semiconductor chip.

Figure 4:
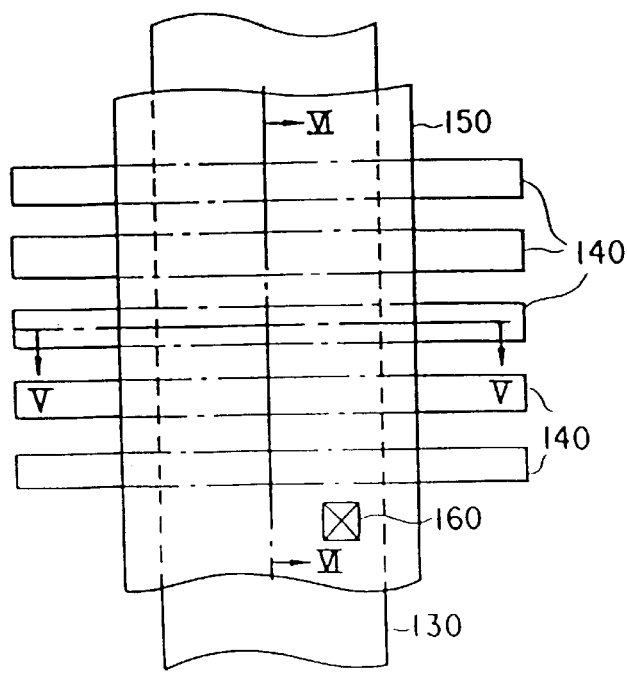
FIG. 4 is an enlarged top plan view of portion 200 of the clip shown in FIG. 3.

FIG. 4 is an enlarged top plan view of the area 200 shown in FIG. 3. As shown in FIG. 4, on the semiconductor chip substrate 190, a dummy pattern composed with poly-silicon (hereinafter called the "dummy electrode layer") is arranged, and on the layer insulation film formed on the dummy electrode layer 130, signal lines 140 used for data transmission between functional blocks 120 are arranged, intersecting with the dummy electrode layer 130 at right angles.

In addition, on the insulation film formed on the signal lines 140, a power-supply wiring layer 150 is formed, extending in parallel to the dummy electrode layer 130. The dummy electrode layer 130 and the power-supply wiring layer 150 are electrically connected via a contact hole 160.

Figure 5:
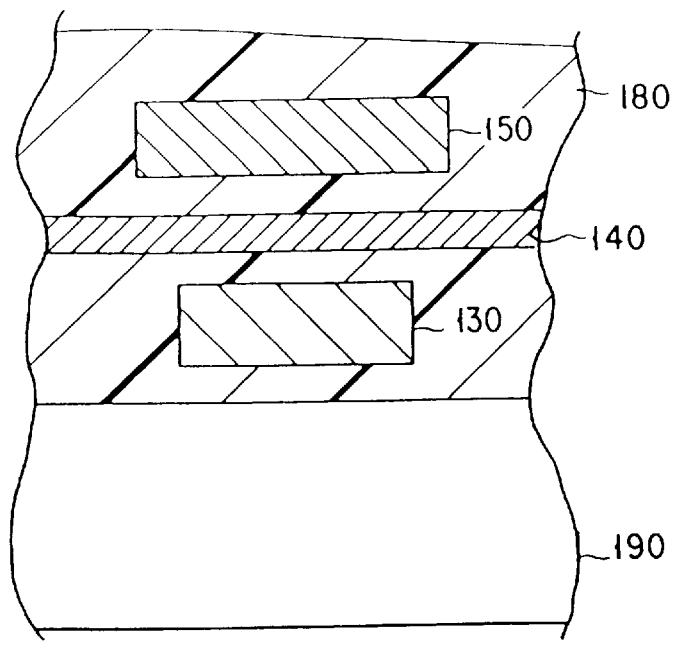
FIG. 5 is a cross-sectional view, taken along line V—V of FIG. 4.

FIG. 5 is a sectional view, taken along line V—V in FIG. 4. As shown in FIG. 5, the spaces between the dummy electrode material layer 130 and the signal wiring 140 and the power supply layer 150 as well as their surroundings are filled with insulation film 180.

Figure 6:
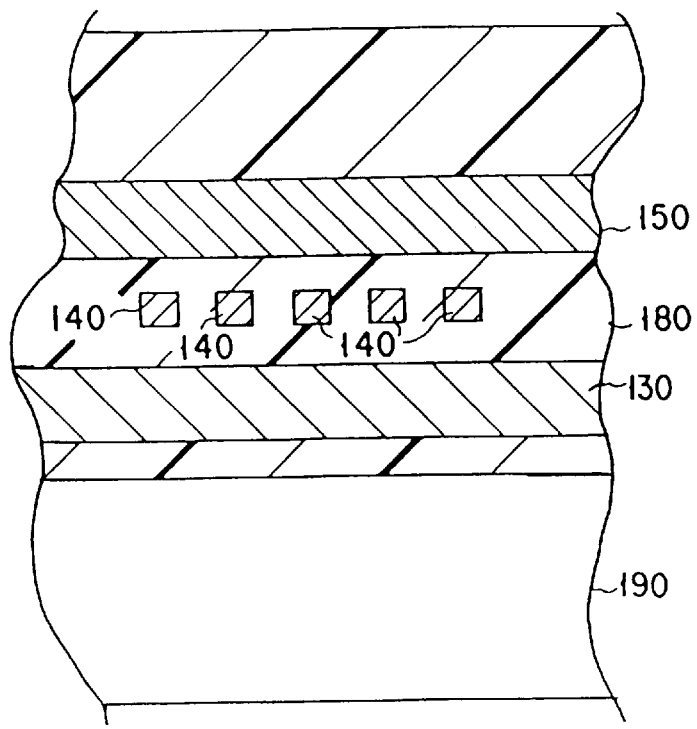
FIG. 6 is a cross-sectional view, taken along line VI—VI of FIG. 4.

FIG. 6 is a sectional view, taken along line VI—VI in FIG. 4. As seen from FIG. 6, the dummy electrode layer 130 is provided on the semiconductor chip substrate 190 for suppressing the electro-loading effect at the time of forming the electrodes of MOS transistors.

Because the dummy electrode layer 130 is intersects with the signal lines 140 almost at right angles, the area intersecting with and superimposed on the signal lines 140 is small. This reduces the parasitic capacitance between the signal wiring 140 and the dummy pattern by the dummy electrode material layer 130.

Because the parasitic capacitance in designing the semiconductor chip can be easily calculated at a high accuracy from the number of intersections of signal lines 140 and dummy electrode layer 130 and the width of the power-supply wiring layer 150, parasitic capacity value can be predicted. This helps improve design quality.

In the embodiment shown in FIGS. 4 to 6, the signal lines 140 are provided above the dummy gate electrode layer 130 and extend substantially at right angles to the layer 130, and the power-supply wiring layer 150 is provided above the lines 140 and extends substantially parallel to the layer 130. Instead, the power-supply wiring layer 150 may be provided above the layer 130 and may extend substantially parallel thereto, and the signal lines 140 may be provided above the layer 150 and may extend substantially at right angles to the gate electrode layer 130.

Referring now to FIG. 7, the second embodiment is described in details.

A pair of the first signal lines 210 are arranged adjacent to both sides of a standard cell 200 equipped with the MOS transistor.

A pair of dummy electrode layers 220 are formed in the standard cell 200. The layers 220 extend in parallel with the power supply layer 230 formed on the relevant top layer via a layer insulation film (not illustrated). They do not overlap with the adjoining pair of signal layer 210.

The dummy electrode layers 220 and the power-supply wiring layer 230 are electrically connected by a contact hole 240. A second signal line 250 for outputting or inputting signals from the standard cell 200 is formed, intersecting with the dummy electrode layer 220 substantially at right angles.

The dummy electrode material layer 220 is made of a poly-silicon layer.

As described above, the dummy electrode layer 220 does not extend in parallel with the second signal line 250, but intersects with the second signal line 250 substantially at right angles. It is therefore possible to reduce the parasitic capacitance generated between the dummy electrode layer 220 and the second signal line 250.

And by the similar reasons described in conjunction with the first embodiment, it is easy to predict the parasitic capacitance in advance.

Unlike the first embodiment, in this embodiment, the dummy electrode layer 220 is arranged near the gate electrode of MOS transistor in the standard cell 200. When the gate electrode of MOS transistor is formed, its size does not much vary from the design value, because electro-loading effect is suppressed.

Additional advantages and modifications will readily occur to those skilled in the art. Therefore, the invention in its broader aspects is not limited to the specific details, and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a semiconductor substrate;
   a dummy gate electrode layer formed on a gate insulation film which is formed on the semiconductor substrate;
   a first insulation film formed above the dummy gate electrode layer;
   a first signal line formed on the first insulation film and intersecting with the dummy gate electrode layer substantially at right angles;
   a second layer insulation film formed above the first signal line;
   a power-supply wiring layer formed on the second layer insulation film and arranged substantially in parallel to and right above the dummy gate electrode layer; and
   a contact hole for electrically connecting the power-supply wiring layer to the dummy gate electrode layer.

2. A semiconductor integrated circuit equipment comprising:
   a semiconductor substrate;
   a dummy gate electrode layer formed on a gate insulation film which is formed on the semiconductor substrate;
   a first insulation film formed on the dummy gate electrode layer;
   power-supply wiring layer formed on the first insulation film and arranged substantially in parallel to and right above the dummy gate electrode layer;
   a second layer insulation film formed on the power supply layer;
   a first signal wiring formed on the second insulation film and intersecting with the dummy gate electrode layer substantially at right angles; and
   a contact hole for electrically connecting the power-supply wiring layer to the dummy gate electrode layer.

3. A semiconductor integrated circuit device comprising:
   a standard cell having a logic circuit and a power-supply wiring layer for supplying power to the logic circuit;
   a first signal line extending substantially parallel to the power-supply wiring layer and arranged in an area with no standard cell formed;
   a dummy gate electrode layer formed on a first insulation film which is provided below the power-supply wiring layer;
   a contact hole for electrically connecting the power-supply wiring layer to the dummy gate electrode layer; and
   a second signal line intersecting with the power-supply wiring layer substantially at right angles and arranged on a second insulation film which is provided above the power-supply wiring layer, for inputting and outputting signals to and from the logic circuit incorporated in the standard cell.

4. The semiconductor integrated circuit device according to claim 3, wherein the logic circuit has at least a MOS transistor with a gate electrode layer, the gate electrode layer and the dummy electrode layer being formed of the same polysilicon layer.

5. A semiconductor integrated circuit device comprising:
   a semiconductor element formed on a semiconductor substrate and having a gate electrode;
   a dummy gate electrode layer formed of the same material as the gate electrode;
   a power-supply wiring layer arranged substantially in parallel to the dummy gate electrode layer and provided on a first layer insulation film, for supplying power to the semiconductor element;
   a contact hole for electrically connecting the dummy gate electrode layer to the power supply layer;
   a first signal line arranged on a second insulation film which is provided above the power-supply wiring layer, intersecting the power-supply wiring layer substantially at right angles; and
   a second signal line arranged in an area other than the area in which the semiconductor element, dummy gate electrode layer, power-supply wiring layer and first signal line are formed, and extending substantially parallel to the dummy gate electrode layer, and made of the same layer as the dummy gate electrode layer.

6. The semiconductor integrated circuit device according to claim 5, wherein the gate electrode and the dummy gate electrode layer are arranged in the same plane.

7. A semiconductor integrated circuit device comprising:
   a semiconductor element having a gate electrode;
   a power-supply wiring layer for supplying power to the semiconductor element;
   a first signal line provided substantially in the same plane as the power-supply wiring layer;
   a dummy gate electrode layer extending parallel to the power-supply wiring layer, arranged on a first insulation film which is provided below the lower surface of the power-supply wiring layer, and arranged in such a manner not to be superimposed on the first-signal line;
   a contact hole for electrically connecting the power-supply wiring layer to the dummy gate electrode layer; and a second signal line intersecting with the power-supply wiring layer substantially at right angles and arranged on the second insulation film which is provided on the power-supply wiring layer.

8. The semiconductor integrated circuit according to claim 7, wherein the gate electrode and the dummy gate electrode layer are arranged in the same plane.

9. A semiconductor integrated circuit device comprising:

a semiconductor substrate;

a gate insulation film formed on the semiconductor substrate;

a gate electrode formed on the gate insulation film, the gate electrode having a first width;

a conductive layer formed on the gate insulation film, the conductive layer being formed of a material which is the same as that of the gate electrode and having a second width;

a first insulation layer formed above the gate electrode and the conductive layer;

a signal line formed on the first insulation layer in a direction perpendicular to at least the conductive layer, the signal line having a third width;

a second insulation layer formed above the signal line;

a power-supply wiring layer formed on the second insulation layer at a position rightly above the conductive layer; and a contact hole through which the power-supply wiring layer and the conductive layer are electrically connected.

10. The semiconductor integrated circuit device according to claim 9, wherein the conductive layer is a dummy gate electrode.

11. The semiconductor integrated circuit device according to claim 9, wherein the first width of the gate electrode is substantially the same as the second width of the conductive layer.

12. The semiconductor integrated circuit device according to claim 9, wherein the power-supply wiring layer has a width wider than the second width of the conductive layer and the third width of the signal line.

13. A semiconductor integrated circuit device comprising:

a standard cell having a logic circuit and a power-supply wiring layer for supplying power to the logic circuit;

a first signal line extending substantially parallel to the power-supply wiring layer and arranged in an area with no standard cell formed;

a first insulation film provided below the power-supply wiring layer;

a dummy gate electrode layer formed on the first insulation film and formed below the power-supply wiring layer;

a contact hole for electrically connecting the power-supply wiring layer to the dummy gate electrode layer; and a second signal line intersecting with the power-supply wiring layer, the first signal line and the dummy gate electrode layer substantially at right angles for inputting and outputting signals to and from the logic circuit in the standard cell.

* * * * *